United States Patent
Xiong et al.

(10) Patent No.: US 12,019,497 B2
(45) Date of Patent: Jun. 25, 2024

(54) PATTERN-BASED ACTIVATION OF MEMORY POWER CONSUMPTION MODE

(71) Applicant: Micron Technology, Inc., Boise, ID (US)

(72) Inventors: Tao Xiong, Shanghai (CN); Guang Chang Ye, Shanghai (CN); Jizhe Xing, Shanghai (CN); Jun Shen, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/272,055

(22) PCT Filed: Dec. 17, 2020

(86) PCT No.: PCT/CN2020/137189
§ 371 (c)(1),
(2) Date: Jun. 23, 2022

(87) PCT Pub. No.: WO2022/126481
PCT Pub. Date: Jun. 23, 2022

(65) Prior Publication Data
US 2023/0350482 A1  Nov. 2, 2023

(51) Int. Cl.
G06F 1/3234 (2019.01)
G06F 1/3225 (2019.01)
G11C 5/14 (2006.01)

(52) U.S. Cl.
CPC .......... *G06F 1/3275* (2013.01); *G06F 1/3225* (2013.01); *G11C 5/14* (2013.01); *G11C 2207/2227* (2013.01)

(58) Field of Classification Search
CPC .... G06F 1/3275; G06F 1/3278; G06F 1/3293; G06F 1/3296; G06F 1/324
See application file for complete search history.

(56) References Cited

U.S. PATENT DOCUMENTS 9,846,478 B1  12/2017  Hulbert et al.
10,474,221 B2  11/2019  Elliott et al.
(Continued)

FOREIGN PATENT DOCUMENTS

| CN | 110580095 | 12/2019 |
| CN | 110651235 | 1/2020 |
| WO | 2022126481 | 6/2022 |

OTHER PUBLICATIONS

"International Application Serial No. PCT CN2020 137189, International Search Report dated Sep. 2, 2021", 5 pgs.
(Continued)

*Primary Examiner* — Raymond N Phan
(74) *Attorney, Agent, or Firm* — Schwegman Lundberg & Woessner, P.A.

(57) ABSTRACT

Various embodiments described herein provide for a method for reduced power consumption by a memory system. A memory system of some embodiments monitors power state change requests received by the memory system from a host system, and determines a pattern of power state change requests received from the host system. Based on the determined pattern, the memory system can decide to activate or deactivate a reduced power consumption mode on the memory system. A reduced power consumption mode can comprise a first set of operation parameters that cause a memory system to operate with lower power consumption than a second set of operation parameters associated with a current operation mode, where the current operation mode is associated with a current power state set or last requested by the host system.

20 Claims, 5 Drawing Sheets

(56) References Cited

U.S. PATENT DOCUMENTS

| | | | |
|---|---|---|---|
| 11,335,416 B1* | 5/2022 | Sforzin | G11C 16/0483 |
| 2013/0198544 A1 | 8/2013 | Ju et al. | |
| 2017/0068479 A1* | 3/2017 | Chin | G11C 11/4074 |
| 2017/0277446 A1 | 9/2017 | Cheong | |
| 2023/0035828 A1* | 2/2023 | Hong | G06F 3/0653 |

OTHER PUBLICATIONS

"International Application Serial No. PCT CN2020 137189, Written Opinion dated Sep. 2, 2021", 4 pgs.
"International Application Serial No. PCT CN2020 137189, International Preliminary Report on Patentability dated Jun. 29, 2023", 5 pages.

* cited by examiner

PATTERN-BASED ACTIVATION OF MEMORY POWER CONSUMPTION MODE

TECHNICAL FIELD

Embodiments of the disclosure relate generally to memory devices and, more specifically, to a method for reduced power consumption by a memory system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
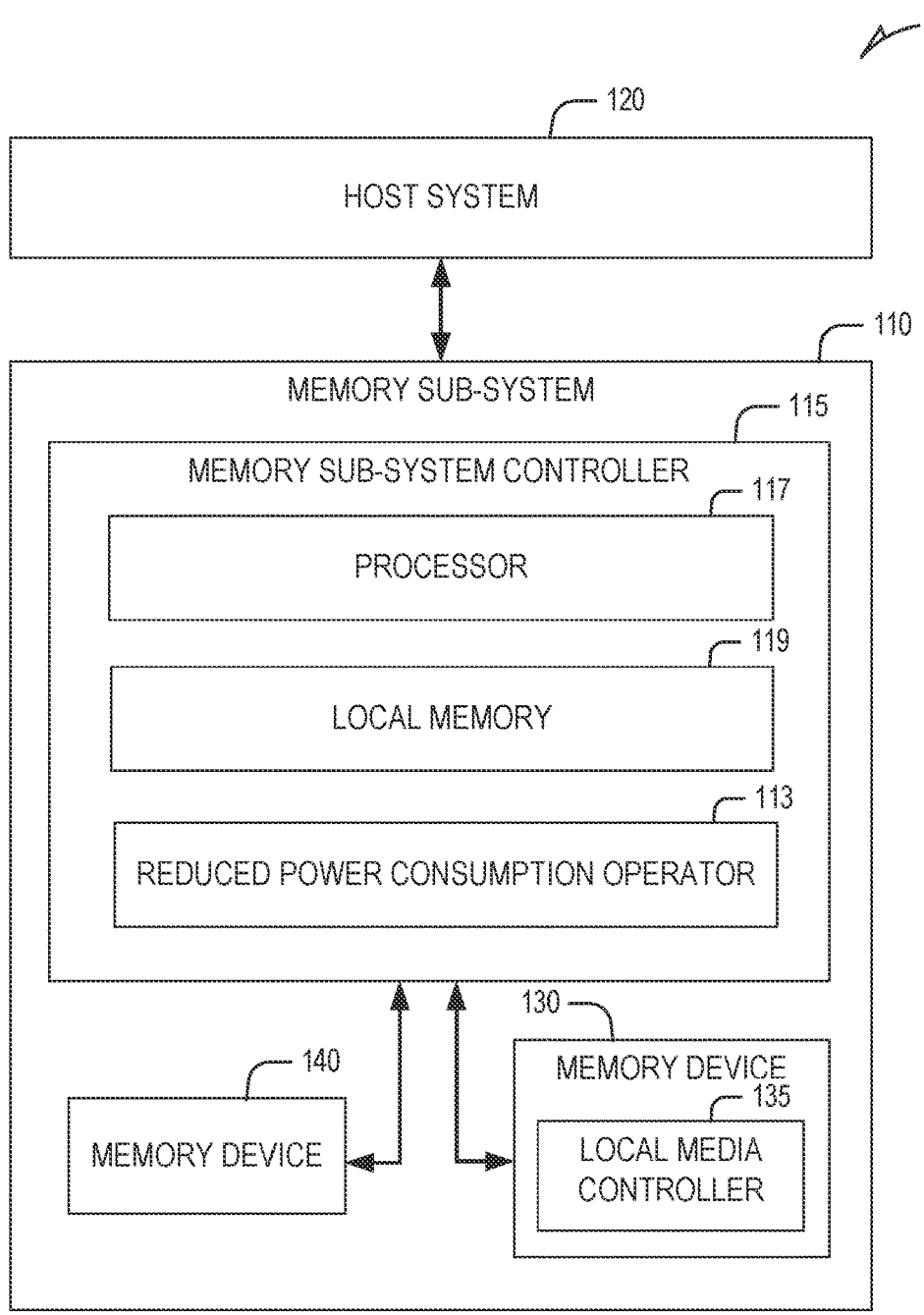
FIG. 1 is a block diagram illustrating an example computing system that includes a memory sub-system, in accordance with some embodiments of the present disclosure.

Aspects of the present disclosure are directed to a method for reduced power consumption by a memory system, such as a memory sub-system described herein. In particular, some embodiments implement a reduced power consumption mode on a memory system, such as a Non-Volatile Memory Express (NVMe) memory system (e.g., NVMe sub-system). Additionally, some embodiment provide for a memory system that activates a reducer power consumption mode based on (e.g., in response to) a pattern of power state change requests (e.g., commands) received from a host system by the memory system.

A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can send access requests to the memory sub-system, such as to store data at the memory sub-system and to read data from the memory sub-system.

The host system can send access requests (e.g., write command, read command) to the memory sub-system, such as to store data on a memory device at the memory sub-system, read data from the memory device on the memory sub-system, or write/read constructs (e.g., such as submission and completion queues) with respect to a memory device on the memory sub-system. The data to be read or written, as specified by a host request, is hereinafter referred to as "host data." A host request can include logical address information (e.g., logical block address (LBA), namespace) for the host data, which is the location the host system associates with the host data. The logical address information (e.g., LBA, namespace) can be part of metadata for the host data. Metadata can also include error handling data (e.g., error-correcting code (ECC) codeword, parity code), data version (e.g., used to distinguish age of data written), valid bitmap (which LBAs or logical transfer units contain valid data), and so forth.

The memory sub-system can initiate media management operations, such as a write operation, on host data that is stored on a memory device. For example, firmware of the memory sub-system may re-write previously written host data from a location of a memory device to a new location as part of garbage collection management operations. The data that is re-written, for example as initiated by the firmware, is hereinafter referred to as "garbage collection data."

"User data" hereinafter generally refers to host data and garbage collection data. "System data" hereinafter refers to data that is created and/or maintained by the memory sub-system for performing operations in response to host requests and for media management. Examples of system data include, and are not limited to, system tables (e.g., logical-to-physical memory address mapping table, also referred to herein as a L2P table), data from logging, scratch pad data, and so forth.

A memory device can be a non-volatile memory device. A non-volatile memory device is a package of one or more die. Each die can be comprised of one or more planes. For some types of non-volatile memory devices (e.g., negative-and (NAND)-type devices), each plane is comprised of a set of physical blocks. For some memory devices, blocks are the smallest area than can be erased. Each block is comprised of a set of pages. Each page is comprised of a set of memory cells, which store bits of data. The memory devices can be raw memory devices (e.g., NAND), which are managed externally, for example, by an external controller. The memory devices can be managed memory devices (e.g., managed NAND), which are a raw memory device combined with a local embedded controller for memory management within the same memory device package.

Traditionally, a host system can instruct or request a memory system (e.g., memory sub-system) to enter or exit a power state, where the power state can cause the memory system to operate according to an operation mode (e.g., operation mode as defined by a power policy of the memory system) associated with the power state. Each operation mode can be defined by a power policy of the memory system, each operation mode can be associated with (e.g., mapped to) one or more power states by the power policy, and each operation mode can define a different set of operation parameters (e.g., settings) by which the memory system can operate. For instance, a host system can send a power state set command to a memory system, which can indicate one of a number of power states supported by the memory system. Each power state can represent a different power management state or configuration for the memory system. Additionally, power states supported by a memory system can be defined by a data storage standard, such as a NVMe standard (e.g., NVMe 1.4) for the memory system (e.g., NVMe solid state drive (SSD)). For instance, power states (e.g., NVMe power states) can include, without limitations, operational power states (such as a power state zero (PS0), a power state one (PS1), and a power state two (PS3)) and non-operational power states (such as a power state three (PS3) and a power state four (PS4)). A given power state can, for example, balance data performance and latency of a memory system with power consumption by the memory system.

Various embodiments described herein provide for a method for reduced power consumption by a memory system. The method of some embodiments can achieve lower power consumption than otherwise provided by conventional memory technology, and can do so while maintaining (or improving) data performance and/or data latency. A memory system of some embodiments monitors power state change requests received by the memory system from a host system, and determines a pattern of power state change requests received from the host system. Based on the determined pattern, the memory system can decide to activate or deactivate a reduced power consumption mode (described herein) on the memory system. A reduced power consumption mode can comprise a first set of operation parameters (e.g., settings) that cause (or can cause) a memory system to operate with lower power consumption than a second set of operation parameters associated with a current operation mode, where the current operation mode is associated with a current power state set or last requested (for the memory system) by the host system. The association of the current operation mode of the memory system and current power state can be defined by a power policy defined on the memory system. As used herein, a power policy on a memory system can be defined and/or managed on the memory system by a power management controller or a power management system that forms part of the memory system.

Disclosed herein are some examples of methods for reduced power consumption by a memory system, as described herein.

FIG. 1 illustrates an example computing system 100 that includes a memory sub-system 110, in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, a secure digital (SD) card, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-systems 110. FIG. 1 illustrates one example of a host system 120 coupled to one memory sub-system 110. As used herein. "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., NVDIMM controller), and a storage protocol controller (e.g., a peripheral component interconnect express (PCIe) controller, serial advanced technology attachment (SATA) controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a SATA interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, SLCs, can store one bit per cell. Other types of memory cells, such as multi-level cells (MLCs), TLCs, quad-level cells (QLCs), and penta-level cells (PLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as NAND type flash memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, and so forth. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical memory address (e.g., physical block address) that are associated with the memory devices 130. The memory sub-system controller 115 can further include host interface circuitry to communicate with the host system 120 via the physical host interface. The host interface circuitry can convert the commands received from the host system 120 into command instructions to access the memory devices 130 and/or the memory device 140 as well as convert responses associated with the memory devices 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local media controller 135) for media management within the same memory device package. An example of a managed memory device is a managed NAND (MNAND) device.

The memory sub-system controller 115 includes a reduced power consumption mode operator 113 that enables or facilitates reduced power consumption by the memory sub-system 110. For some embodiments, based on the reduced power consumption mode operator 113, the memory sub-system controller 115 monitors power state change requests received by the memory sub-system 110 from the host system 120. Over time, the memory sub-system controller 115 can receive one or more power state change requests from the host system 120. The host system 120 can send a power state change request, for example, based on software operation on the host system 120, such as an operating system causing the host system 120 to enter or exit a sleep mode or idle mode. Each power state change request from the host system 120 can comprise an instruction or a command (e.g., PS set command) to set the memory sub-system 110 to a specified power state. Examples of power states that can be specified by the host system 120 can include, without limitations, PS0, PS1, PS2, PS3, and PS4. Additionally, one or more of PS1, PS1, and PS2 represent operational power states for the memory sub-system 110, while one or both of PS3 and PS4 represent non-operational power states for the memory sub-system 110. In response to a power state change request received by the memory sub-system 110, the memory sub-system 110 can change (or at least attempt to change) from a current power state (e.g., PS3 or PS4) of the memory sub-system 110 to the power state (e.g., PS0, PS1, or PS2) specified by the power state change request. For some embodiments, the memory sub-system controller 115 monitors for power state change requests received by the memory sub-system 110 periodically or continuously. The monitoring can result in generation and updating of data stored on the memory sub-system 110 (e.g., volatile or non-volatile memory of the memory sub-system 110) to record a history of power state change requests received by the memory sub-system 110 from the host system 120.

Based on the reduced power consumption mode operator 113, the memory sub-system controller 115 of some embodiments determines (e.g., detects) a current pattern of power state change requests received from the host system 120, where the determination is based on the monitoring of power state change requests received by the memory sub-system 110 from the host system 120. Additionally, for some embodiments, the memory sub-system controller 115 determines or redetermines the current pattern of power change requests (received by the memory sub-system 110 from the host system 120) periodically, continuously, or in response to each new power state request received by the memory sub-system 110 from the host system 120.

For some embodiments, the reduced power consumption mode operator 113 causes the memory sub-system controller 115 to determine whether the memory sub-system controller 115 should activate a reduced power consumption mode on the memory sub-system 110 based on the current pattern of power state change requests determined (e.g., detected) by the memory sub-system controller 115. In particular, the memory sub-system controller 115 can determine whether the current pattern of power state change requests determined by the memory sub-system controller 115 satisfies a condition for activating the reduced power consumption mode on the memory sub-system 110. In response to the determination, the memory sub-system controller 115 (based on the reduced power consumption mode operator 113) can cause activation of the reduced power consumption mode on the memory sub-system 110. Depending on the embodiment, the activation of the reduced power consumption mode on the memory sub-system 110 can be enabled or facilitated using a power management controller or a power management system included by the memory sub-system 110.

For various embodiments, the reduced power consumption mode differs from an individual operation mode associated with an individual power state (e.g., associated by a policy of the memory sub-system 110) currently being requested by the host system 120 (e.g., an individual power state that is currently being requested by the host system 120 via an individual power state change request last received by the memory sub-system 110 from the host system 120). For example, the power state change request last received by the memory sub-system 110 from the host system 120 can specify an operational power state (e.g., PS1), where an operation mode of the memory sub-system 110 associated with the specified operation power state comprises a PS1 operation mode. Generally, the memory sub-system 110 can use a set of operation parameters defined by an operation mode (e.g., as defined by a power policy or power management policy) associated with a power state specified/requested by the host system 120. In comparison, the reduced power consumption mode can differ from the individual operation mode associated with the power state last requested by the host system 120, and the reduced power consumption mode can be an operation mode that is not associated with any power state specified by a power state change request from the host system 120. According to some embodiments, the reduced power consumption mode defines a first set of operation parameters for the memory sub-system 110, where the first set of operation parameters is configured to cause the memory sub-system 110 to consume less power than a second set of operation parameters defined by the individual operation mode.

By activating the reduced power consumption mode on the memory sub-system 110, various embodiments described herein effectively ignore or override activation of an individual operation mode that is associated with a power state specified by a power state change request last received by the memory sub-system 110 from the host system 120 (e.g., where a power policy defined on the memory sub-system 110 associates the individual operation mode with the specified power state). In other words, but for the activation of the reduced power consumption mode on the memory sub-system 110, various embodiments described herein would activate the individual operation mode on the memory sub-system 110 based on the power state change request last received from the host system 120.

The set of operation parameters defined by a reduced power consumption mode can vary between different embodiments. For instance, the set of operation parameters (of the reduced power consumption mode) can cause the memory sub-system 110 to reduce a number of active lanes within a physical layer interconnect that operably couples the memory sub-system 110 to the host system 120. The reduction in the number of active lanes can result in reduced power consumption by the memory sub-system 110. The physical layer interconnect can comprise, for example, a physical layer defined by a Peripheral Component Interconnect Express (PCIe) standard.

As another example, the set of operation parameters (of the reduced power consumption mode) can cause the memory sub-system 110 to reduce a data speed (e.g., link speed) of a physical layer interconnect that operably couples the memory sub-system 110 to the host system 120, which can result in reduced power consumption by the memory sub-system 110. For instance, the set of operation parameters can cause the memory sub-system 110 to switch from PCIe Generation 4 operation (e.g., ~1 W of power usage) to PCIe Generation 3 operation (e.g., ~700 mW of power usage), which can result in a reduction in data speed (e.g., link speed) between the host system 120 and the memory sub-system 110 but can also reduce power consumption by the memory sub-system 110.

In another instance, the set of operation parameters (of the reduced power consumption mode) can cause the memory sub-system 110 to enter an active idle mode earlier than usual (e.g., earlier than defined by a normal operation mode). For example, based on the set of operation parameters, the memory sub-system 110 can enter an active idle mode after a first amount of time (e.g., 12 ms), where the first amount of time is less than a second amount of time (e.g., 65 ms) defined by an individual operation mode associated with an individual power state currently being requested by the host system 120. For some embodiments, the active idle mode is specified by a Non-Volatile Memory Express (NVMe) standard (e.g., NVMe 1.4). During active idle mode, the memory sub-system 110 can cause all processors (e.g., processing cores in a central processing unit) on the host system 120 to use a lower reference clock (e.g., slower clock than usual, 25 MHz) when interacting (e.g., operating) with the memory sub-system 110. Additionally, the active idle mode can comprise a deep active idle mode, where the memory sub-system 110 can cause a primary processor (e.g., primary processing core in a central processing unit) on the host system 120 to use a low reference clock (e.g., slower clock than usual, 25 MHz) when operating with the memory sub-system 110, cause the host system 120 to gate off the reference clock to any remaining processors (e.g., processing cores), and can cause the memory sub-system 110 to enter self-refresh mode.

The set of operation parameters (of the reduced power consumption mode) can, for example, to disable logging of debug information on the memory sub-system 110. In doing so, the memory sub-system 110 can reduce power consumption by performing one or less operations to log, maintain, update, or manage the debug information that is generated by the memory sub-system 110.

As another example, the set of operation parameters (of the reduced power consumption mode) can cause the memory sub-system 110 to increase a frequency of sending link state acknowledgments (e.g., from sending 1 acknowledgment per a millisecond, to 5 acknowledgements per a millisecond), from the memory sub-system 110 to the host system 120, in response to the host system 120 sending any power change request that requests the memory sub-system 110 to enter or exit a non-operational power state. For some embodiments, a link state acknowledgment is in accordance with a Link State (hereafter, PCIe Link State) that is defined by a Peripheral Component Interconnect Express (PCIe) standard. For instance, an embodiment can increase a frequency of sending Link State 1 (L1.0) acknowledgements in response to the host system 120 sending any power change request that requests the memory sub-system 110 to enter or exit PS3 or PS4. Additionally, the set of operation parameters (of the reduced power consumption mode) can cause the memory sub-system 110 to send link state acknowledgments, from the memory sub-system 110 to the host system 120, with increased frequency (more frequency than the memory sub-system 110 would otherwise) in response to the host system 120 sending any power change request that requests the memory sub-system 110 to enter PS0 while the outstanding command count on the memory sub-system 110 is zero.

The condition for activating a reduced power consumption mode can vary between different embodiments. For example, the reduced power consumption mode operator 113 can cause the memory sub-system controller 115 to cause the reduced power consumption mode to activate on the memory sub-system 110 in response to the memory sub-system controller 115 determining that the current pattern of power state change requests indicates that the host system is frequently requesting activation (e.g., frequently sending power state change requests for activation) of a non-operational power state on the memory sub-system 110. For instance, an embodiment can cause the reduced power consumption mode to activate on the memory sub-system 110 in response to determining that the host system 120 requests activation of a non-operational power state (e.g., PS3 or PS4) more than x times (e.g., 4 times) in a span of y time (e.g., 4 seconds). For some embodiments, the host system 120 requesting activation of a non-operational power state more than x times in a span of y time is an indication that the host system 120 is currently experiencing low workload.

The reduced power consumption mode operator 113 can cause the memory sub-system controller 115 to continue monitoring power state change requests received by the memory sub-system 110 from the host system 120 (e.g., monitor continuously or periodically) while the reduced power consumption mode is active on the memory sub-system 110. While the reduced power consumption mode is active on the memory sub-system 110, the reduced power consumption mode operator 113 can cause the memory sub-system controller 115 to redetermine the current pattern of power state change requests received from the host system 120 based on monitoring the power state change requests received by the memory sub-system 110 from the host system 120. Based on the current pattern of power state change requests redetermined by the memory sub-system controller 115, the reduced power consumption mode operator 113 can cause the memory sub-system controller 115 to determine whether to deactivate the reduced power consumption mode (that is currently active) on the memory system. In response to the determination, the memory sub-system controller 115 (based on the reduced power consumption mode operator 113) can cause deactivation of the reduced power consumption mode on the memory sub-system 110. For some embodiments, the memory sub-system controller 115 deactivates the reduced power consumption mode (that is currently activated) by activating (e.g., switching to) another operation mode of the memory sub-system 110, such as the individual operation mode associated with the individual power state currently being requested or last requested by the host system 120.

The condition for deactivating a reduced power consumption mode can vary between different embodiments. For instance, an embodiment can cause the reduced power consumption mode to deactivate on the memory sub-system 110 in response to determining that the current pattern of power state change requests indicates that the host system 120 has not requested activation of the non-operational power state after (e.g., within) a predetermined period of time (e.g., within a span of z time, such as z=3 seconds). For some embodiments, the host system 120 not requesting activation of a non-operational power state after a z period of time is an indication that the host system 120 is currently experiencing high workload (e.g., higher workload than the low workload the host system 120 was experiencing when the reduced power consumption mode was activated).

Figure 2:
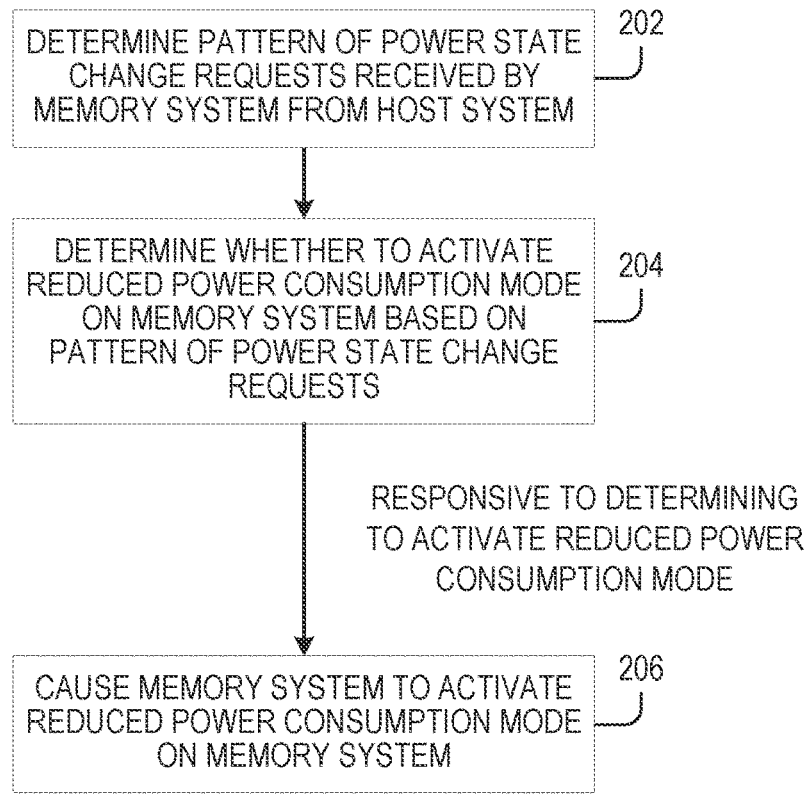
FIGS. 2 and 3 are flow diagrams of example methods for reduced power consumption by a memory system, in accordance with some embodiments of the present disclosure.
Figure 3:
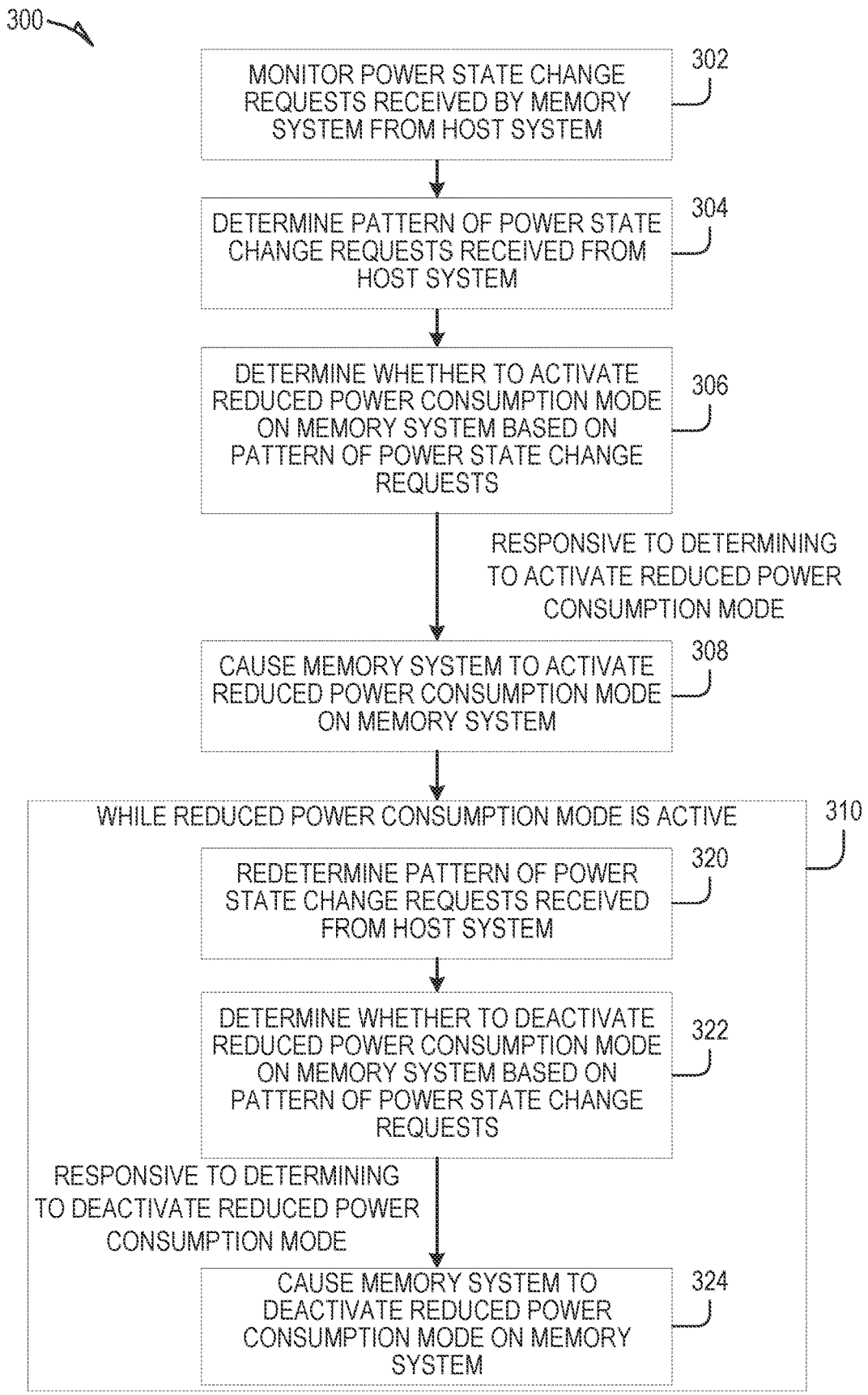

FIGS. 2 and 3 are flow diagrams of example methods for reduced power consumption by a memory system, in accordance with some embodiments of the present disclosure. The methods 200, 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, at least one of the methods 200, 300 is performed by the memory sub-system controller 115 of FIG. 1 based on the reduced power consumption mode operator 113. Additionally, or alternatively, for some embodiments, at least one of the methods 200, 300 is performed, at least in part, by the local media controller 135 of the memory device 130 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are used in every embodiment. Other process flows are possible.

Referring now to the method 200 of FIG. 2, for some embodiments, the method 200 is invoked upon, soon after, a memory system (e.g., memory sub-system 110) starting up (e.g., booting up). At operation 202, a processing device (e.g., the processor 117 of the memory sub-system controller 115) determines a current pattern of power state change requests received by the memory system (e.g., the memory sub-system 110) from a host system (e.g., 120) operably coupled to the memory system.

Based on the current pattern of power state change requests determined at operation 202, the processing device (e.g., the processor 117) determines whether to activate a reduced power consumption mode on the memory system (e.g., the memory sub-system 110) at operation 204. According to some embodiments, the reduced power consumption mode is different from an individual operation mode associated with an individual power state last requested by the host system (e.g., 120), where the individual power state is last requested by an individual power state change request last received by the memory system (e.g., the memory sub-system 110) from the host system (e.g., 120). For various embodiments, the reduced power consumption mode defines a first set of operation parameters for the memory system (e.g., the memory sub-system 110), where the first set of operation parameters is configured to cause the memory system (e.g., the memory sub-system 110) to consume less power than a second set of operation parameters defined by the individual operation mode (associated with the individual power state requested by the last individual power state change request). As described herein, the individual operation mode can represent an operation mode of the memory system (e.g., the memory sub-system 110) that would otherwise be activated on the memory system (e.g., the memory sub-system 110) if the reduced power consumption mode is not activated by an embodiment described herein. Depending on the embodiment, the individual power state can be selected from a group comprising a power state zero (PS0), a power state one (PS1), a power state two (PS2), a power state three (PS3), and a power state four (PS4).

For some embodiments, the first set of operation parameters (of the reduced power consumption mode) causes the memory system (e.g., the memory sub-system 110) to reduce a number of active lanes within a physical layer interconnect, where the physical layer interconnect operably couples the memory system (e.g., the memory sub-system 110) to the host system (e.g., 120). The physical layer interconnect can, for example, comprise a Peripheral Component Interconnect Express (PCIe) physical layer. For some embodiments, the first set of operation parameters (of the reduced power consumption mode) causes the memory system (e.g., the memory sub-system 110) to enter an active idle mode after a first amount of time, where the first amount of time is less than a second amount of time defined by the individual operation mode associated with the individual power state, and where the active idle mode is specified by a Non-Volatile Memory Express (NVMe) standard. For some embodiments, the first set of operation parameters (of the reduced power consumption mode) causes the host system (e.g., 120) to use a low reference clock to interact with the memory system (e.g., the memory sub-system 110). For some embodiments, the first set of operation parameters (of the reduced power consumption mode) causes the memory system (e.g., the memory sub-system 110) to disable logging of debug information on the memory system. Additionally, for some embodiments, the first set of operation parameters (of the reduced power consumption mode) causes the memory system (e.g., the memory sub-system 110) to increase a frequency of sending link state acknowledgments, from the memory system (e.g., the memory sub-system 110) to the host system (e.g., 120) in response to the host system (e.g., 120) sending any power change request that requests the memory system (e.g., the memory sub-system 110) to enter or exit a non-operational power state. The link state acknowledgments can be in accordance with a Link State that is defined by a PCIe standard.

In response to determining to activate the reduced power consumption mode on the memory system (e.g., the memory sub-system 110), at operation 206, the processing device (e.g., the processor 117) causes the reduced power consumption mode to activate on the memory system (e.g., the memory sub-system 110). For instance, the processing device (e.g., the processor 117) can determine to activate the reduced power consumption mode on the memory system in response to determining that the current pattern of power state change requests indicates that the host system (e.g., 120) is requesting activation of a non-operational power state on the memory system more than a predetermined number of times within a predetermined amount of time. The non-operational power state comprises at least one of PS3 or PS4.

Referring now to the method 300 of FIG. 3, for some embodiments, the method 300 is invoked upon, soon after, a memory system (e.g., memory sub-system 110) starting up (e.g., booting up). At operation 302, a processing device (e.g., the processor 117 of the memory sub-system controller 115) monitors power state change requests received by the memory system (e.g., the memory sub-system 110) from a host system (e.g., 120) operably coupled to the memory system. Additionally, the processing device (e.g., the processor 117) can receive of one or more power state change requests from the host system (e.g., 120) operably coupled to the memory system, where the one or more power state change requests can be received as part of the monitoring the power state change requests at operation 302. According to some embodiments, operations 304, 306 and 308 are respectively similar operations 202, 204, 206 described above with respect to FIG. 2.

At operation 310, while the reduced power consumption mode is active on the memory system (e.g., after activation by operation 308), the processing device (e.g., the processor 117) can perform operations 320, 322, 324. At operation 320, the processing device (e.g., the processor 117) redetermines the current pattern of power state change requests received from the host system (e.g., 120) based on the processing device (e.g., the processor 117) monitoring the power state change requests received by the memory system (by operation 302). The processing device (e.g., the processor 117), at operation 322, determines whether to deactivate the reduced power consumption mode on the memory system based on the current pattern of power state change requests as redetermined by operation 320. By operation 322, various embodiments can update the current pattern based on the monitoring. In response to determining to deactivate the reduced power consumption mode on the memory system, the processing device (e.g., the processor 117) causes the memory system (e.g., the memory sub-system 110) to deactivate the reduced power consumption mode on the memory system at operation 324. For instance, the processing device (e.g., the processor 117) can determine to deactivate the reduced power consumption mode on the memory system in response to determining that the current pattern of power state change requests indicates that the host system (e.g., 120) has not requested activation of the non-operational power state after (e.g., within) the predetermined period of time. For some embodiments, the reduced power consumption mode is deactivated on the memory system (e.g., the memory sub-system 110) by causing the memory system to activate the individual operation mode associated with the individual power state requested by the host system via a last-received power state change request.

Figure 4:
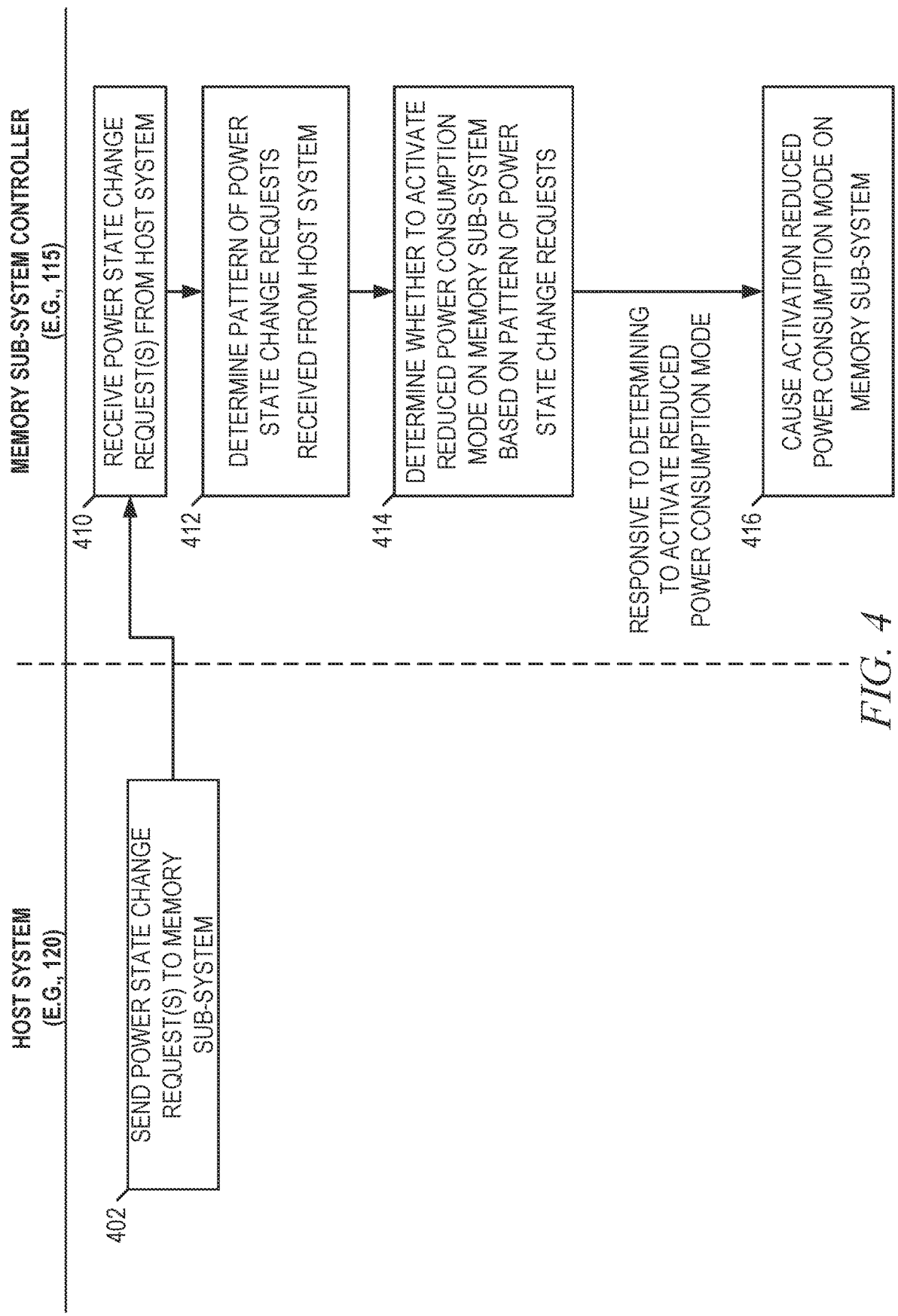
FIG. 4 provides an interaction diagram illustrating interactions between components of a computing environment in the context of some embodiments in which a method for reduced power consumption by a memory system as described herein is performed.

FIG. 4 provides an interaction diagram illustrating interactions between components of a computing environment in the context of some embodiments in which a method for reduced power consumption by a memory system as described herein is performed. The operations of the method can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method is performed by a host system (e.g., 120), a memory sub-system controller (e.g., 115), a memory device (e.g., 130 or 140), or some combination thereof. Although the operations are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are used in every embodiment. In the context of the example illustrated in FIG. 4, the host system can include the host system 120, and the memory sub-system controller can include the memory sub-system controller 115.

As shown in FIG. 4, at operation 402, the host system 120 sends one or more power state change requests to the memory sub-system 110. The memory sub-system controller 115 receives the one or more power state change requests from the host system 120 at operation 410. Based on the one or more power state change requests received by operation 410, at operation 412, the memory sub-system controller 115 determines a current pattern of power state change requests received by the memory sub-system 110 from the host system 120. At operation 414, the memory sub-system controller 115 determines whether to activate a reduced power consumption mode on the memory sub-system 110 based on the current pattern of power state change requests determined at operation 412. In response to the memory sub-system controller 115 determining to activate the reduced power consumption mode, the memory sub-system controller 115 causes activation of the reduced power consumption mode on the memory sub-system 110 at operation 416.

Figure 5:
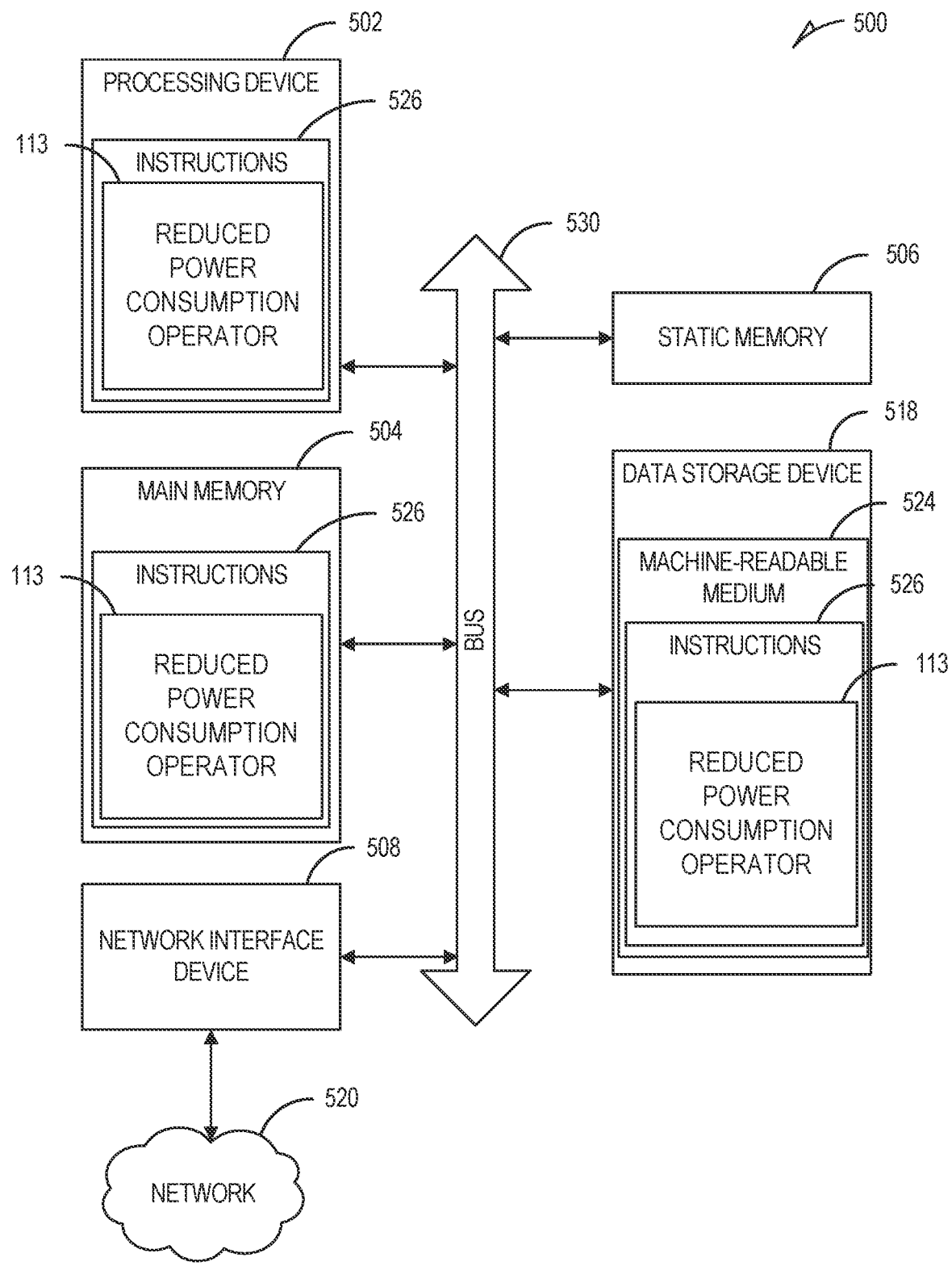
FIG. 5 is a block diagram of an example computer system in which embodiments of the present disclosure may operate.

FIG. 5 illustrates an example machine in the form of a computer system 500 within which a set of instructions can be executed for causing the machine to perform any one or more of the methodologies discussed herein. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations described herein. In alternative embodiments, the machine can be connected (e.g., networked) to other machines in a local area network (LAN), an intranet, an extranet, and/or the Internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage device 518, which communicate with each other via a bus 530.

The processing device 502 represents one or more general-purpose processing devices such as a microprocessor, a central processing unit, or the like. More particularly, the processing device 502 can be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processing device 502 can also be one or more special-purpose processing devices such as an application specific integrated circuit (ASIC), a field programmable gate array (FPGA), a digital signal processor (DSP), a network processor, or the like. The processing device 502 is configured to execute instructions 526 for performing the operations and steps discussed herein. The computer system 500 can further include a network interface device 508 to communicate over a network 520.

The data storage device 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage device 518, and/or main memory 504 can correspond to the memory sub-system 110 of FIG. 1.

In one embodiment, the instructions 526 include instructions to implement a reduced power consumption mode of a memory system as described herein (e.g., the reduced power consumption mode operator 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer-readable storage medium, such as, but not limited to, any type of disk including floppy disks, optical disks. CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory system comprising:
a memory device; and
a processing device, operably coupled to the memory device, configured to perform operations comprising:
monitoring power state change requests received by the memory system from a host system operably coupled to the memory system;
determining a current pattern of power state change requests received from the host system based on the monitoring, each power state change request being a request for the memory system to enter or exit a power state;
determining whether to activate a reduced power consumption mode on the memory system based on the current pattern, the reduced power consumption mode being different from an individual operation mode associated with an individual power state last requested by the host system, the reduced power consumption mode defining a first set of operation parameters configured to cause the memory system to consume less power than a second set of operation parameters defined by the individual operation mode; and
in response to determining to activate the reduced power consumption mode, causing the memory system to activate the reduced power consumption mode on the memory system.

2. The memory system of claim 1, wherein the determining whether to activate the reduced power consumption mode on the memory system based on the current pattern comprises:
determining whether the current pattern indicates that the host system is requesting activation of a non-operational power state on the memory system more than a predetermined number of times within a predetermined amount of time; and
in response to determining that the current pattern indicates that the host system is requesting activation of a non-operational power state on the memory system more than a predetermined number of times within a predetermined amount of time, determining to activate the reduced power consumption mode on the memory system.

3. The memory system of claim 1, wherein the individual power state is selected from a group comprising a power state zero (PS0), a power state one (PS1), a power state two (PS2), a power state three (PS3), and a power state four (PS4).

4. The memory system of claim 1, wherein the operations further comprise:
while the reduced power consumption mode is active on the memory system:
redetermining the current pattern received from the host system based on the monitoring the power state change requests received by the memory system from the host system;
determining whether to deactivate the reduced power consumption mode on the memory system based on the current pattern; and
in response to determining to deactivate the reduced power consumption mode, causing the memory system to deactivate the reduced power consumption mode on the memory system.

5. The memory system of claim 4, wherein the determining whether to deactivate the reduced power consumption mode on the memory system based on the current pattern comprises:
  determining whether the current pattern indicates that the host system has not activated a non-operational power state after a predetermined period of time; and
  in response to determining that the current pattern indicates that the host system has not requested activation of the non-operational power state within the predetermined period of time, determining to deactivate the reduced power consumption mode on the memory system.

6. The memory system of claim 1, wherein the memory system is operably coupled to the host system by a physical layer interconnect, and wherein the first set of operation parameters causes the memory system to reduce a number of active lanes within the physical layer interconnect.

7. The memory system of claim 1, wherein the first set of operation parameters causes the memory system to enter an active idle mode after a first amount of time, the first amount of time being less than a second amount of time defined by the individual operation mode associated with the individual power state, the active idle mode being specified by a Non-Volatile Memory Express (NVMe) standard.

8. The memory system of claim 1, wherein the first set of operation parameters causes the host system to use a low reference clock to interact with the memory system.

9. The memory system of claim 1, wherein the first set of operation parameters causes the memory system to disable logging of debug information on the memory system.

10. The memory system of claim 1, wherein the first set of operation parameters causes the memory system to increase a frequency of sending link state acknowledgments, from the memory system to the host system, in response to the host system sending any power change request that requests the memory system to enter or exit a non-operational power state, the link state acknowledgments being in accordance with a Link State that is defined by a Peripheral Component Interconnect Express (PCIe) standard.

11. The memory system of claim 2, wherein the non-operational power state comprises at least one of a power state three (PS3) or a power state four (PS4).

12. The memory system of claim 5, wherein the non-operational power state comprises at least one of a power state three (PS3) or a power state four (PS4).

13. The memory system of claim 6, wherein the physical layer interconnect comprises a Peripheral Component Interconnect Express (PCIe) physical layer.

14. The memory system of claim 5, wherein the reduced power consumption mode is deactivated on the memory system by causing the memory system to activate the individual operation mode associated with the individual power state.

15. A method comprising:
  receiving, at a memory system, one or more power state change requests from a host system operably coupled to the memory system;
  determining, at the memory system, a current pattern of power state change requests received by the memory system from the host system, each power state change request being a request for the memory system to enter or exit a power state;
  determining, at the memory system, whether to activate a reduced power consumption mode on the memory system based on the current pattern, the reduced power consumption mode being different from an individual operation mode associated with an individual power state last requested by the host system, the reduced power consumption mode defining a first set of operation parameters configured to cause the memory system to consume less power than a second set of operation parameters defined by the individual operation mode; and
  in response to determining to activate the reduced power consumption mode, activating the reduced power consumption mode on the memory system.

16. The method of claim 15, wherein the determining whether to activate the reduced power consumption mode on the memory system based on the current pattern comprises:
  determining whether the current pattern indicates that the host system has requested activation of a non-operational power state more than a predetermined number of times within a predetermined period of time; and
  in response to determining that the current pattern indicates that the host system has requested activation of the non-operational power state more than the predetermined number of times within the predetermined period of time, determining to activate the reduced power consumption mode on the memory system.

17. The method of claim 15, wherein the memory system is operably coupled to the host system by a physical layer interconnect, and wherein the first set of operation parameters causes the memory system to reduce a number of active lanes within the physical layer interconnect.

18. The method of claim 15, wherein the first set of operation parameters causes the memory system to enter an active idle mode after a first amount of time, the first amount of time being less than a second amount of time defined by the individual operation mode associated with the individual power state, the active idle mode being specified by a Non-Volatile Memory Express (NVMe) standard.

19. The method of claim 15, wherein the first set of operation parameters causes the host system to use a low reference clock to interact with the memory system.

20. At least one non-transitory machine-readable storage medium comprising instructions that, when executed by a processing device of a memory system, cause the processing device to perform operations comprising:
  determining a current pattern of power state change requests received by the memory system from a host system operably coupled to the memory system, each power state change request being a request for the memory system to enter or exit a power state;
  determining whether to activate a reduced power consumption mode on the memory system based on the current pattern, the reduced power consumption mode being different from an individual operation mode associated with an individual power state last requested by the host system, the reduced power consumption mode defining a first set of operation parameters configured to cause the memory system to consume less power than a second set of operation parameters defined by the individual operation mode; and
  in response to determining to activate the reduced power consumption mode, causing the reduced power consumption mode to activate on the memory system.

* * * * *